United States Patent [19]

Kressel et al.

[11] 4,023,062
[45] May 10, 1977

[54] LOW BEAM DIVERGENCE LIGHT EMITTING DIODE

[75] Inventors: Henry Kressel, Elizabeth; Michael Ettenberg, Freehold, both of N.J.

[73] Assignee: RCA Corporation, New York, N.Y.

[22] Filed: Sept. 25, 1975

[21] Appl. No.: 616,598

[52] U.S. Cl. .................................. 313/498; 357/16
[51] Int. Cl.² ..................... H01J 1/62; H01L 29/161
[58] Field of Search .......... 313/498, 499, 501, 502, 313/503, 504, 506, 509, 511; 357/16

[56] References Cited

UNITED STATES PATENTS

| | | | |
|---|---|---|---|
| 3,582,573 | 6/1971 | Miller | 179/100.3 |
| 3,667,007 | 5/1972 | Kressel et al. | 317/235 R |
| 3,677,836 | 7/1972 | Lorenz | 148/171 |
| 3,758,875 | 9/1973 | Hayashi | 357/16 X |
| 3,911,376 | 10/1975 | Thompson | 357/16 |

OTHER PUBLICATIONS

"A GaAs-Al$_x$Ga$_{1-x}$As Double Hetero-Structure Planar Stripe Laser" Yonezu et al., Japanese Journal of Appl. Phys., vol. 12, No. 10, Oct. 1973.

"Threshold Current Density and Lasing Traverse Mode in a GaAs-Al$_x$Ga$_{1-x}$As Double Hetrojunction Laser", Yonezu et al., Japanese Journal of Appl. Phys., vol. 12, No. 10, Oct. 1973, pp. 1593.

"Characteristics of the Junction-Strine-Geometry GaAs-GaAlAs Double Heterojunction Laser", Namizaki et al., Japanese Journal of Appl. Physics, vol. 13, No. 10, Oct. 1974, p. 1618.

Primary Examiner—Rudolph V. Rolinec
Assistant Examiner—Vincent J. Sunderdick
Attorney, Agent, or Firm—Glenn H. Bruestle; Daniel N. Calder

[57] ABSTRACT

A body of single crystalline semiconductor material has a first region of one conductivity type spaced from a second region of an opposite conductivity type with a third region between and contiguous to each of the first and second regions. The junctions between the third and each of the first and second regions are heterojunctions. At the peak emission wavelength of the third region the index of refraction of each of the first and second regions is at least 3% less than the index of refraction of the third region. Furthermore, each of the first and second regions has an energy band gap greater than that of the third region, with the difference in the energy band gap being greater than 0.1 eV. The thickness of the third region between heterojunctions is less than 0.125 microns. The difference in index of refraction and band gap energy at the heterojunctions and the thickness of the third region, as stated, provides a waveguide for light generated in the third region which results in the emission of light of a low beam divergence.

8 Claims, 4 Drawing Figures

LOW BEAM DIVERGENCE LIGHT EMITTING DIODE

BACKGROUND OF THE INVENTION

The invention herein disclosed was made in the course of or under a contract or subcontract thereunder with the Department of the Navy.

The present invention relates to semiconductor light emitting diodes and more specifically to light emitting diodes having a low beam divergence.

Semiconductor light emitting diodes (LED) in general, are bodies of single crystalline semiconductor material which when biased, emit incoherent light, through the recombination of pairs of oppositely charged carriers. Typically, the light generated is a light emitting diode is near the P-N junction plane and light that is generated propagates uniformly in all directions. In viewing such light emitting diodes from either an edge or a surface, the emission of the light appears uniform in all directions. This light emission is referred to by those skilled in the art as Lambertion. The divergence of a Lambertion light beam is such that the full width at half the maxium of the optical intensity, referred to as FWHM, is 120° C.

In a field such as optical communications, where light emitting diodes are coupled into light transmission pipes, such as an optical fiber, it becomes critical that the beam divergence of the light emitted from the LED be as narrow as possible for the efficient coupling of the generated light into the fiber. Thus, it would be most desirable in fields utilizing light emitting diodes, that the beam divergence be small.

SUMMARY OF THE INVENTION

A semiconductor light emitting diode with reduced light emission divergence includes a body of single crystalline semiconductor material having a first region of one conductivity type, a second region of a conductivity type opposite to that of said first region and a third region between and contiguous to the first and second regions. The junctions between the third region and each of the first and second regions are heterojunctions. The index of refraction of each of the first and second regions is at least 3% less than the index of refraction of the third region at the peak emission wavelength of the third region. Each of the first and second regions has an energy band gap greater than that of the third region, with the difference in the energy band gap being greater than 0.1 eV. The third region has a thickness between each of the heterojunctions of less than 0.125 microns.

DETAILED DESCRIPTION OF THE INVENTION

Figure 1:
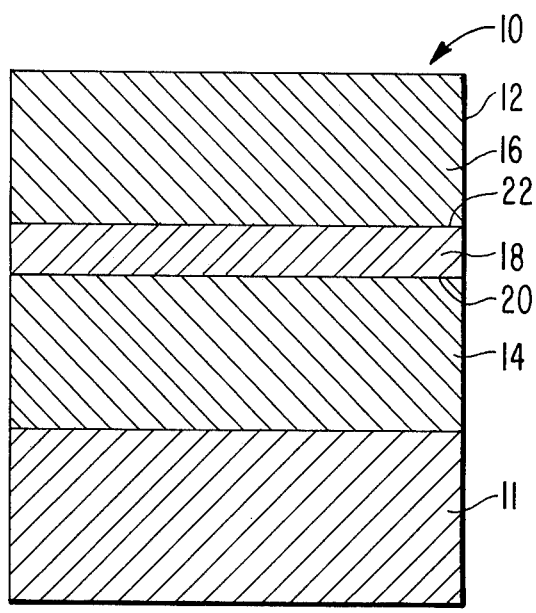
FIG. 1 is a cross-sectional view of a first embodiment of a light emitting diode of the present invention.

Referring to FIG. 1, the first embodiment of the semiconductor light emitting diode device (LED) of the present invention is designated as 10. The light emitting diode 10 has a body 12 of semiconductor material capable of generating radiation when biased with a voltage, such as the group III-V semiconductor materials. The body 12 includes a substrate 11 of one conductivity type. On a surface of the substrate 11 is a first region 14 of the same conductivity type as the substrate 11. The first region 14 is spaced from and opposite a second region 16 of the opposite conductivity type, with a third region 18 between and contiguous to both first and second regions 14 and 16. The third region 18 may be of either conductivity type, but for the purpose of describing the present invention it is assumed that the third region 18 is of the same conductivity type as the second region 16. Furthermore, for the purpose of describing the LED 10 of the present invention it is assumed that the substrate 11 and first region 14 are of N type conductivity, while the second and third region 16 and 18 are of P type conductivity.

Between the first and third regions 14 and 18 is a first junction 20 and between the second and third regions 16 and 18 is a second junction 22. The first junction 20 is a P-N junction. The thickness of the third region 18, which is the active region of the LED 10, from the first junction 20 to the second junction 22 is less than 0.125 microns.

Figure 2:
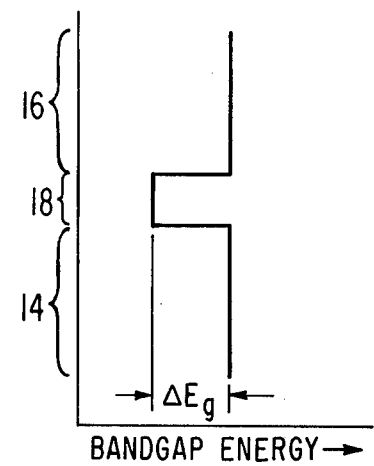
FIG. 2 is a graph showing the band gap energy of the three regions of the light emitting diode of FIG. 1.
Figure 3:
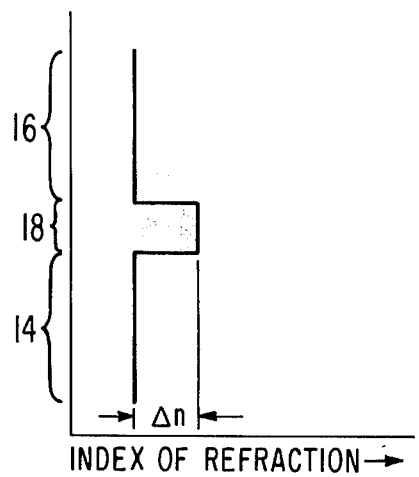
FIG. 3 is a graph showing the index of refraction of the three regions of the light emitting diode of FIG. 1.

There is a difference between the composition of the semiconductor materials of each of the first and second regions 14 and 16 with respect to the third region 18. Thus, the first and second junctions 20 and 22 are both heterojunctions. Furthermore, the difference in semiconductor material composition, is such that at the peak emission wavelength of the third region 18 the index of refraction of each of the first and second regions 14 and 16 is at least 3% less than the index of refraction of the third region 18. Also, each of the first and second regions has an energy band gap greater than that of the third region 18, with the difference in the energy band gap being greater than 0.1 eV. The difference in index of refraction is referred to as $\Delta n$ in FIG. 3 and the difference in band gap energy is referred to as $\Delta Eg$ in FIG. 2.

There are various semiconductor materials, particularly among the groups III-V semiconductor compounds and alloys thereof, which have different band gap energies and indices of refraction which can be used for the regions of the LED 10. For the purpose of describing the LED 10 of the present invention it is assumed that the third region 18 is of gallium arsenide. The first and second regions 14 and 16 are assumed to be aluminum gallium arsenide which has a higher band gap energy but lower index of refraction than gallium arsenide.

The band gap energy and index of refraction of aluminum gallium arsenide can be varied by varying the amount of aluminum in the compound. In the example of the Led 10 as stated when the concentration of aluminum $x$ in the aluminum gallium arsenide $Al_xGa_{1-x}As$ is approximately 0.1 or greater, but less than 1.0, desired difference in band gap energy, and indices of refraction between the third region 18 and each of the first and second regions 14 and 16 can be achieved.

While the difference in index of refraction and band gap energy at the first and second junctions 20 and 22 should fall within the limits previously stated, it is anticipated by the present invention that the difference in index of refraction and band gap energy, respectively, need not be the same at both junctions 20 and 22.

In the operation of LED 10, the device is forward biased by having the first region 14 of N-type conductivity at a negative electrical potential, and the second region 16 of P-type conductivity at a positive electrical potential. When the LED 10 is forward biased, the potential barrier at the P-N junction is reduced with respect to electrons from the first region 14. These electrons are injected into the third region 18, but the potential barrier at the PN junction 20 is not significantly reduced with respect to holes in the third region 18, and essentially no holes are injected into the first region 14.

In essence the injected electrons are confined to the third region 18 since the potential barrier between the second and third regions 16 and 18 makes the probability of injecting electrons into the second region 16 very small.

The injected electrons undergo radiative recombination in the third region 18 with the result that light is generated in the third region 18. Since the third region 18 has an index of refraction higher than the index of refraction of each of the first and second regions 14 and 16 at the peak emission wavelength, much of the generated light is confined within the third region. The heterojunctions 20 and 22 form a light waveguide in the plane of the P-N junction 20 surrounding the third region 18. This waveguide serves to guide the generated light to the emitting edge of the LED 10. By having a difference in index of refraction where each of the first and second regions 14 and 16 are at least 3% less than that of the third region 18, at the peak emission wavelength of the third region 18, a difference in the band gap energy where each of the first and second regions 14 and 16 has a band gap energy greater than that of the third region 18 with the difference in band gap being greater than 0.1 eV, and a thickness of the third region 18 of less than 0.125 microns, the waveguide provided directs the light with only a small angular divergence from the plane of the waveguide resulting in a small angular divergency of the emitting light. The LED 10 emits a light beam having an FWHM in the range of 20° to 50° whereas a typical semiconductor LED having a P-N junction will emit light having a beam divergence at the FWHM in the range of 60° to 120°.

Also the light output efficiency of the LED 10 is higher, i.e., in the range of 1%, which indicates that a large proportion of the generated light is propogated down the waveguide. Thus, the light is coupled into the waveguide which is a phenomena thought by those in the art to only occur in laser devices.

The semiconductor LED 10 may be made by epitaxially depositing the regions on the substrate 11 with the first region 14 being deposited first then the third region 18 on the first region 14 and finally the second region 16 on the third region 18. The regions are preferably deposited by liquid phase epitaxy. The regions may be sequentially deposited on the substrate by liquid phase epitaxy by using the method and apparatus described in U.S. Pat. No. 3,897,281 issued July 29, 1975 to S.L. Gilbert et al, entitled "Method For Epitaxially Growing A Semiconductor Material On A Substrate From The Liquid Phase."

In the method described in U.S. Pat. No. 3,897,281 charges of the semiconductor material and conductivity modifiers to be deposited are placed in the wells of a refractory furnace boat. A substrate is placed in a slide which extends longitudinally through the boat and across the bottom of the wells. The boat and its contents are heated to a predetermined temperature and the charges become molten. After reaching the predetermined temperature the slide is moved into a first well and the furnace contents are cooled. During the cooling of the molten charge the semiconductor material is deposited onto the substrate. The substrate is sequentially moved into the remaining wells while the furnace contents are cooled for the further deposition of the semiconductor material in the wells.

Figure 4:
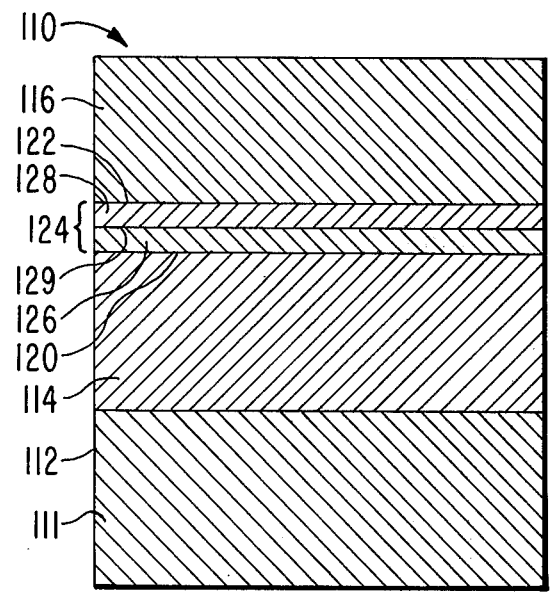
FIG. 4 is a cross-sectional view of the second embodiment of the light emitting diode of the present invention.

Referring to FIG. 4, a second embodiment of the LED of the present invention is designated as 110. The LED 110 includes a body 112 of single crystalline semiconductor material having a substrate 111. On a surface of the substrate 111 is a first region 114 with a second region 116 spaced from and opposite the first region 114 and a third region 124 is between and contiguous to both the first and second regions 114 and 116. The junctions 120 and 122 between the third region 124 and each of the first and second regions 114 and 116, respectively, are heterojunctions. The substrate 111, first region 114, second region 118 and junctions 120 and 122 are the same as the substrate 11, first region 14, second region 16 and junctions 20 and 22 of the first embodiment.

In both the first and second embodiments of the present invention the third regions 18 and 124 respectively are the active regions. Like the third region 18 the third region 124 is of a thickness of less than 0.125 microns in thickness. The second embodiment differs from the first embodiment in that the third region 124 includes a first layer 126 of one conductivity type in contact with a second layer 128 of the opposite conductivity type with a third junction 129 therebetween. Thus, the third junction 129 is a P-N junction. The first layer 126 is on a surface of the first region 114 opposite the third junction 129. The second layer 128 is on a surface of the second region 116 opposite the third junction 129. For purposes of explaining the present invention it is assumed that the first layer 126 is of N type conductivity and the second layer 128 is of P type conductivity. The first and second layers 126 and 128 may be of the same material such as gallium arsenide. GaAs, or aluminum gallium arsenide, $Al_xGa_{1-x}As$. Although it is anticipated that the first and second layers 126 and 128 can be of different semiconductor materials, such as when one layer is of gallium arsenide and the other layer is of aluminum gallium arsenide. Even if the first and second layers 126 and 128 are of the same material, such as aluminum gallium arsenide, $Al_xGa_{1-x}As$, where $0<x<1$, the aluminum concentration may be different in each layer. In the case where either both the first and second layers 126 and 128 are each of aluminum gallium arsenide, or in the case where one of the layers is of gallium arsenide and the other is of aluminum gallium arsenide, the difference in aluminum concentration $\Delta x$ between both layers is no more than 0.05.

Like the first embodiment, the index of refraction of each of the first and second regions 114 and 116 is at least 3% less than that of the third region 124 at the peak emission wavelength of the third region 124, and each of the first and second regions 114 and 116 have an energy band gap greater than that of the third region 124, with the difference in the band gap being greater than 0.1 eV.

The operation of the second embodiment will be the same as that of the first embodiment. As for the fabrication of the second embodiment it is the same as that described for the first embodiment, except that forming the third region 124 entails first epitaxially growing a first layer 126 and then a second layer 128 on the first layer 126. Thus, there is emitted from the LED of the present invention a radiation beam having reduced beam divergence.

We claim:

1. A semiconductor light emitting diode with reduced light emission divergence comprising:

a body of single crystalline semiconductor material having a first region of one conductivity type, a second region of a conductivity type opposite to that of said first region and a third region between and contiguous to said first and second regions, the junctions between the third region and each of the first and second regions being heterojunctions, with the index of refraction of each of the first and second regions being at least 3% less than the index of refraction of said third region at the peak emission wavelength of said third region, each of said first and second regions having an energy band gap greater than that of said third region with the difference in the energy band gap being greater than 0.1 eV and said third region having a thickness, between each of said heterojunctions, of less than 0.125 microns.

2. The semiconductor light emitting diode in accordance with claim 1 wherein said third region is of the conductivity type of either said first or second regions.

3. The semiconductor light emitting diode in accordance with claim 2 wherein said first region is of N type conductivity and said second and third regions are of P type conductivity.

4. The semiconductor light emitting diode in accordance with claim 2 wherein said first region and second region are of $Al_xGa_{1-x}As$ and said third region is of GaAs.

5. The semiconductor light emitting diode in accordance with claim 4 wherein the aluminum concentration $x$ is about 0.1 or more.

6. The semiconductor light emitting diode in accordance with claim 3 wherein said body further comprises a substrate such that said first region is in intimate contact with a surface of said substrate.

7. the semiconductor light emitting diode in accordance with claim 6 wherein said substrate is gallium arsenide of N type conductivity.

8. The semiconductor laser in accordance with claim 1 wherein said third region comprises a first layer of one conductivity type on a surface of said first region and a second layer of the opposite conductivity on said first layer with a P-N junction therebetween.

* * * * *